(12) United States Patent
Mochida

(10) Patent No.: US 10,393,343 B2
(45) Date of Patent: Aug. 27, 2019

(54) LIGHT FLUX CONTROL MEMBER, LIGHT-EMITTING DEVICE, AND AREA LIGHT SOURCE DEVICE

(71) Applicant: Enplas Corporation, Saitama (JP)

(72) Inventor: Toshihiko Mochida, Saitama (JP)

(73) Assignee: ENPLAS CORPORATION, Saitama (JP)

( * ) Notice: Subject to any disclaimer, the term of this patent is extended or adjusted under 35 U.S.C. 154(b) by 0 days.

(21) Appl. No.: 15/757,442

(22) PCT Filed: Aug. 30, 2016

(86) PCT No.: PCT/JP2016/075307
§ 371 (c)(1),
(2) Date: Mar. 5, 2018

(87) PCT Pub. No.: WO2017/038810
PCT Pub. Date: Mar. 9, 2017

(65) Prior Publication Data
US 2018/0245770 A1 Aug. 30, 2018

(30) Foreign Application Priority Data

Sep. 4, 2015 (JP) .................................. 2015-174771

(51) Int. Cl.
*F21V 3/02* (2006.01)
*F21V 5/04* (2006.01)
(Continued)

(52) U.S. Cl.
CPC ................ *F21V 5/045* (2013.01); *F21V 3/02* (2013.01); *F21V 13/04* (2013.01);
(Continued)

(58) Field of Classification Search
CPC ......... F21V 5/04; G02B 19/0004–0028; G02F 1/133603; G02F 1/133611; G02F 2001/133607
See application file for complete search history.

(56) References Cited

U.S. PATENT DOCUMENTS

2008/0013322 A1 1/2008 Ohkawa
2009/0116245 A1* 5/2009 Yamaguchi .............. G02B 3/04
362/311.01
(Continued)

FOREIGN PATENT DOCUMENTS

JP 2007-294187 A 11/2007
JP 2011-023204 A 2/2011
WO 2014/033985 A1 3/2014

OTHER PUBLICATIONS

International Search Report from International Application No. PCT/JP2016/075307 dated Nov. 1, 2016.

*Primary Examiner* — Mariceli Santiago
(74) *Attorney, Agent, or Firm* — Brundidge & Stanger, P.C.

(57) ABSTRACT

The purpose of the present invention is to provide a light flux control member capable of suppressing brightness variation due to light refracted by an inclined surface. The light flux control member comprises: an entry surface which is an inner surface of a recess portion formed on a back side; an emission surface which is formed on a front side; and an annular groove portion which is formed on the back side and outside the entry surface. The annular groove portion includes an outside inclined surface and an inside surface. The inside surface includes a plurality of retroreflective portions.

5 Claims, 13 Drawing Sheets

(51) Int. Cl.
*F21V 13/04* (2006.01)
*G02B 19/00* (2006.01)
*H01L 33/58* (2010.01)
*F21Y 105/16* (2016.01)
*F21Y 115/10* (2016.01)
*G02F 1/1335* (2006.01)

(52) U.S. Cl.
CPC ..... *G02B 19/0028* (2013.01); *G02B 19/0061* (2013.01); *F21Y 2105/16* (2016.08); *F21Y 2115/10* (2016.08); *G02F 1/133603* (2013.01); *G02F 1/133606* (2013.01); *G02F 1/133611* (2013.01); *G02F 2001/133607* (2013.01); *H01L 33/58* (2013.01)

(56) References Cited

U.S. PATENT DOCUMENTS

| | | | |
|---|---|---|---|
| 2014/0168999 A1* | 6/2014 | Li | ............................ F21V 5/045 362/338 |
| 2015/0260371 A1 | 9/2015 | Takatori | |
| 2018/0188608 A1* | 7/2018 | Fujii | ................. G02F 1/133611 |

\* cited by examiner

LIGHT FLUX CONTROL MEMBER, LIGHT-EMITTING DEVICE, AND AREA LIGHT SOURCE DEVICE

TECHNICAL FIELD

The present invention relates to a light flux controlling member that controls distribution of light emitted from a light emitting element. In addition, the present invention relates to a light emitting device having the light flux controlling member, and a surface light source device having the light emitting device.

BACKGROUND ART

Some transmission type image display apparatuses such as liquid crystal display apparatuses use a direct surface light source device as a backlight. In recent years, direct surface light source devices having a plurality of light emitting elements as the light source have been used.

For example, a direct surface light source device includes a substrate, a plurality of light emitting elements, a plurality of light flux controlling members (lens) and a light diffusion member. Each of the light emitting elements is, for example, a light-emitting diode (LED) such as a white light-emitting diode. The light emitting elements are disposed on the substrate in a matrix. The light flux controlling member that spreads the light of the light emitting element in the surface direction of the substrate is disposed over each light emitting element. The light emitted from the light flux controlling member is diffused by the light diffusion member so as to illuminate an illumination member (for example, a liquid crystal panel) in a planar fashion.

FIGS. 1A to 1C illustrate a configuration of a conventional light flux controlling member. FIG. 1A is a perspective view as viewed from a rear side, FIG. 1B is a perspective view illustrating a cross-section as viewed from a rear side, and FIG. 1C is a sectional view. It is to be noted that the leg part provided on the rear side is omitted in FIGS. 1A and 1B. As illustrated in FIGS. 1A to 1C, conventional light flux controlling member 20 includes incidence surface 22 on which light emitted from a light emitting element is incident, and emission surface 24 configured to emit light incident on incidence surface 22 to the outside. Incidence surface 22 is a surface recessed with respect to the light emitting element, and is formed to face the light emitting surface of the light emitting element.

FIGS. 2A and 2B illustrate light paths of light flux controlling member 20. FIG. 2A illustrates light paths of light beams emitted from a light emission center of light emitting element 10 at an emission angle of 30 degrees, and FIG. 2B illustrates light paths of light beams emitted from a light emission center of light emitting element 10 at an emission angle of 40 degrees. Here, the "emission angle" is an angle (θ in FIG. 2A) of a light beam with respect to light axis LA of light emitting element 10. It is to be noted that the leg part provided on the rear side is omitted in FIGS. 2A and 2B.

As illustrated in FIGS. 2A and 2B, light emitted from light emitting element 10 enters light flux controlling member 20 from incidence surface 22. The light having entered light flux controlling member 20 reaches emission surface 24 and is emitted from emission surface 24 to the outside (solid line arrow). At this time, the light is refracted by the shape of emission surface 24, and accordingly the travelling direction of the light is controlled. Meanwhile, a part of the light having reached emission surface 24 is reflected (fresnel-reflected) at emission surface 24 and reaches rear surface 26 opposite to the substrate on which light emitting element 10 is mounted (broken line arrow). When the light having reached rear surface 26 is reflected at rear surface 26, the light travelling toward a part right above light flux controlling member 20 is excessively increased, and consequently non-uniformity of the distribution (luminance unevenness) of the luminance of the light applied by the light-emitting device is caused. In addition, when the light having reached rear surface 26 is emitted from rear surface 26, the light is absorbed by the substrate and consequently significant loss of light results. In view of this, PTL 1 proposes a light flux controlling member for solving the above-mentioned problems.

FIGS. 3A to 3C illustrate a configuration of light flux controlling member disclosed in PTL 1. FIG. 3A is a perspective view as viewed from a rear side, FIG. 3B is a perspective view illustrating a cross section as viewed from a rear side, and FIG. 3C is a sectional view. It is to be noted that the leg part provided on the rear side is omitted in FIGS. 3A and 3B. As illustrated in FIGS. 3A to 3C, in light flux controlling member 30 disclosed in PTL 1, a recess is formed on rear surface 26. The recess includes inclined surface 32 which is provided on the outer side, and parallel surface 34 which is substantially parallel to central axis CA and is provided on the inner side. Inclined surface 32 is rotationally symmetrical (circularly symmetrical) about central axis CA of light flux controlling member 30, and is tilted at a predetermined angle (for example, 45 degrees) to a virtual line orthogonal to central axis CA.

FIGS. 4A and 4B illustrate light paths of light flux controlling member 30. FIG. 4A illustrates light paths of light beams emitted from a light emission center of light emitting element 10 at an emission angle of 30 degrees, and FIG. 4B illustrates light paths of light beams emitted from a light emission center of light emitting element 10. It is to be noted that the leg part provided on the rear side is omitted in FIGS. 4A and 4B. As illustrated in FIGS. 4A and 4B, light fresnel-reflected at emission surface 24 reaches a predetermined portion of rear surface 26. By forming inclined surface 32 in the above-mentioned predetermined portion, at least a part of the light reaching inclined surface 32 can be reflected in the lateral direction (see FIGS. 4A and 4B).

In this manner, in light flux controlling member 30 disclosed in PTL 1, light reflected at emission surface 24 does not tend to be directed toward a part right above light flux controlling member 30, or does not tend to be absorbed by the substrate. Accordingly, a light-emitting device having light flux controlling member 30 disclosed in PTL 1 can uniformly and efficiently emit light in comparison with a conventional light-emitting device having light flux controlling member 20.

CITATION LIST

Patent Literature

PTL 1
Japanese Patent Application Laid-Open No. 2011-23204

SUMMARY OF INVENTION

Technical Problem

However, the light incident on the incidence surface of the light flux controlling member disclosed in PTL 1 travels inside the light flux controlling member, and a part of the light reaches inner surface 34 of the recess. A large part of the light reaching inner surface 34 passes through inner surface 34 and is refracted by inclined surface 32 (see FIG. 11). Accordingly, when the light that has passed through inner surface 34 is refracted by inclined surface 32, the quantity of light travelling in a particular direction is excessively large. Thus, an annular high luminance region is formed in the light emitted from the light flux controlling member, and consequently luminance unevenness results.

To solve such problems, an object of the present invention is to provide a light flux controlling member that includes an inclined surface configured to reflect light reflected by the emission surface and can reduce luminance unevenness resulting from light refracted by the inclined surface.

In addition, another object of the present invention is to provide a light-emitting device including the light flux controlling member, and a surface light source device including the light-emitting device.

Solution to Problem

A light flux controlling member according to the embodiment of the present invention is configured to control distribution of light emitted from a light-emitting element, the light flux controlling member including: an incidence surface that is an interior surface of a recess formed to intersect a central axis of the light flux controlling member on a rear side of the light flux controlling member, the incidence surface being configured to allow incidence of light emitted from the light-emitting element; an emission surface formed to intersect the central axis on a front side of the light flux controlling member, the emission surface being configured to emit, to outside, light incident on the incidence surface; and an annular groove part formed outside the incidence surface on the rear side to surround the central axis. The annular groove part includes an outer inclined surface tilted such that a distance of the outer inclined surface from the central axis increases toward the rear side, and an inner surface disposed on an inner side relative to the outer inclined surface with respect to the central axis, the outer inclined surface is tilted at an angle at which at least a part of light which has entered the light flux controlling member from the incidence surface and has been fresnel-reflected by the emission surface is reflected in a direction away from the central axis, and the inner surface includes a plurality of retro-reflection parts configured to reflect, at least two times, the light which has entered the light flux controlling member from the incidence surface to retro-reflect the light toward the incidence surface.

A light-emitting device according to the embodiment of the present invention includes: a light-emitting element; and the above-mentioned light flux controlling member. The central axis of the light flux controlling member and a light axis of the light-emitting element coincide with each other.

A surface light source device according to the embodiment of the present invention includes: the above-mentioned light-emitting device; and a light diffusion member configured to allow light from the light-emitting device to pass through the light diffusion member while diffusing the light.

Advantageous Effects of Invention

The light flux controlling member according to an embodiment of the present invention does not tend to cause luminance unevenness of emission light. In addition, the light-emitting device and the surface light source device according to the embodiment of the present invention include the light flux controlling member that does not tend to cause luminance unevenness, and therefore do not tend to cause luminance unevenness of emission light.

DESCRIPTION OF EMBODIMENTS

A light flux controlling member, a light-emitting device, and a surface light source device according to an embodiment of the present invention are described in detail below with reference to the accompanying drawings. In the following description, as a typical example of the surface light source device according to the embodiments of the present invention, a surface light source device suitable for a backlight of a liquid crystal display apparatus will be described. When used with a member (for example, a liquid crystal panel) configured to be irradiated with light from the surface light source device, the surface light source device can be used as a display apparatus.

(Configurations of Surface Light Source Device and Light-Emitting Device)

Figure 5A:
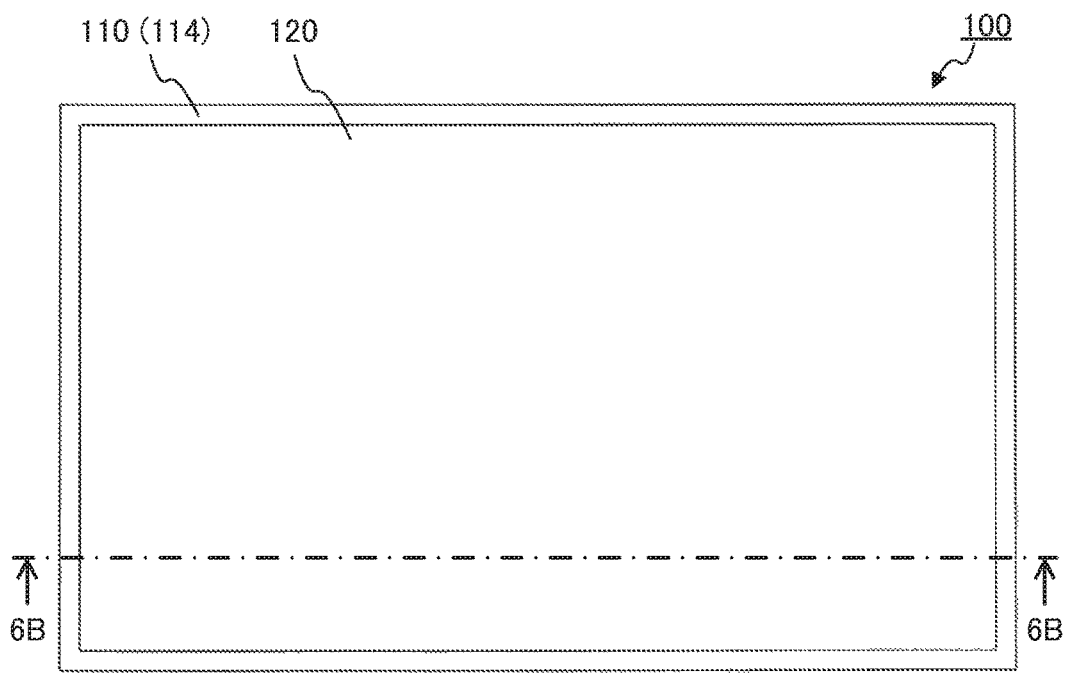
FIGS. 5A and 5B illustrate a configuration of a surface light source device according to an embodiment of the present invention.
Figure 5B:
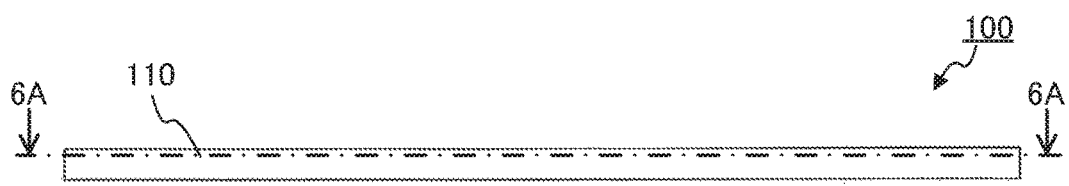
Figure 6A:
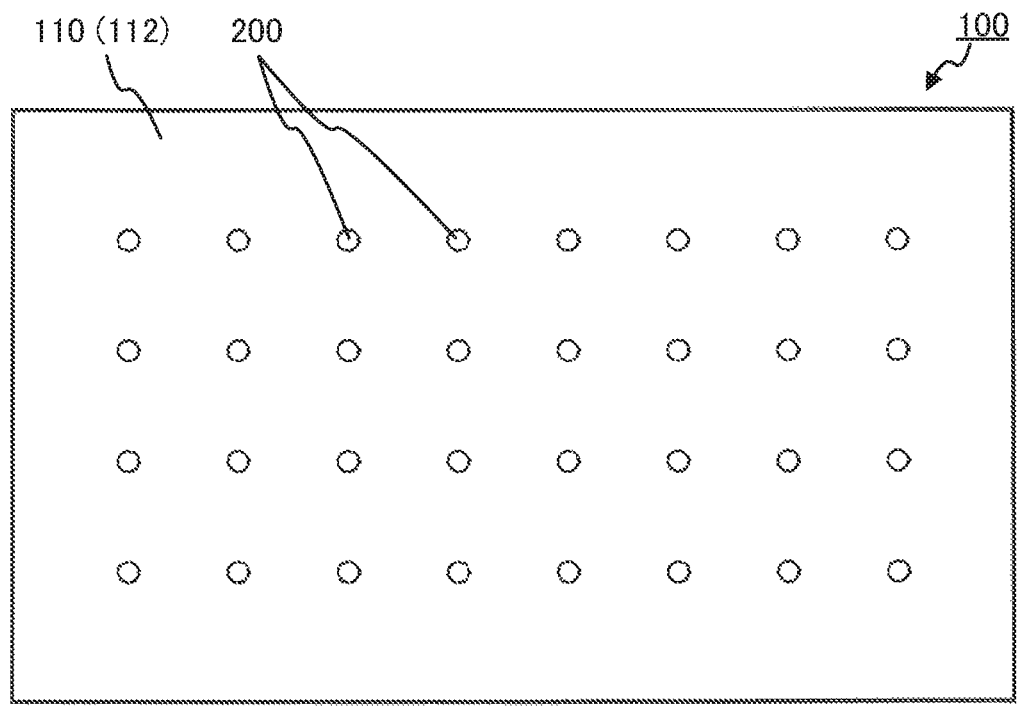
FIGS. 6A and 6B are sectional views illustrating a configuration of the surface light source device according to the embodiment of the present invention.
Figure 6B:
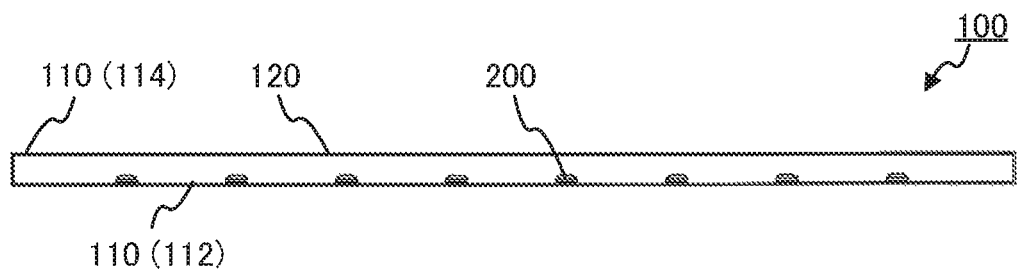
Figure 7:
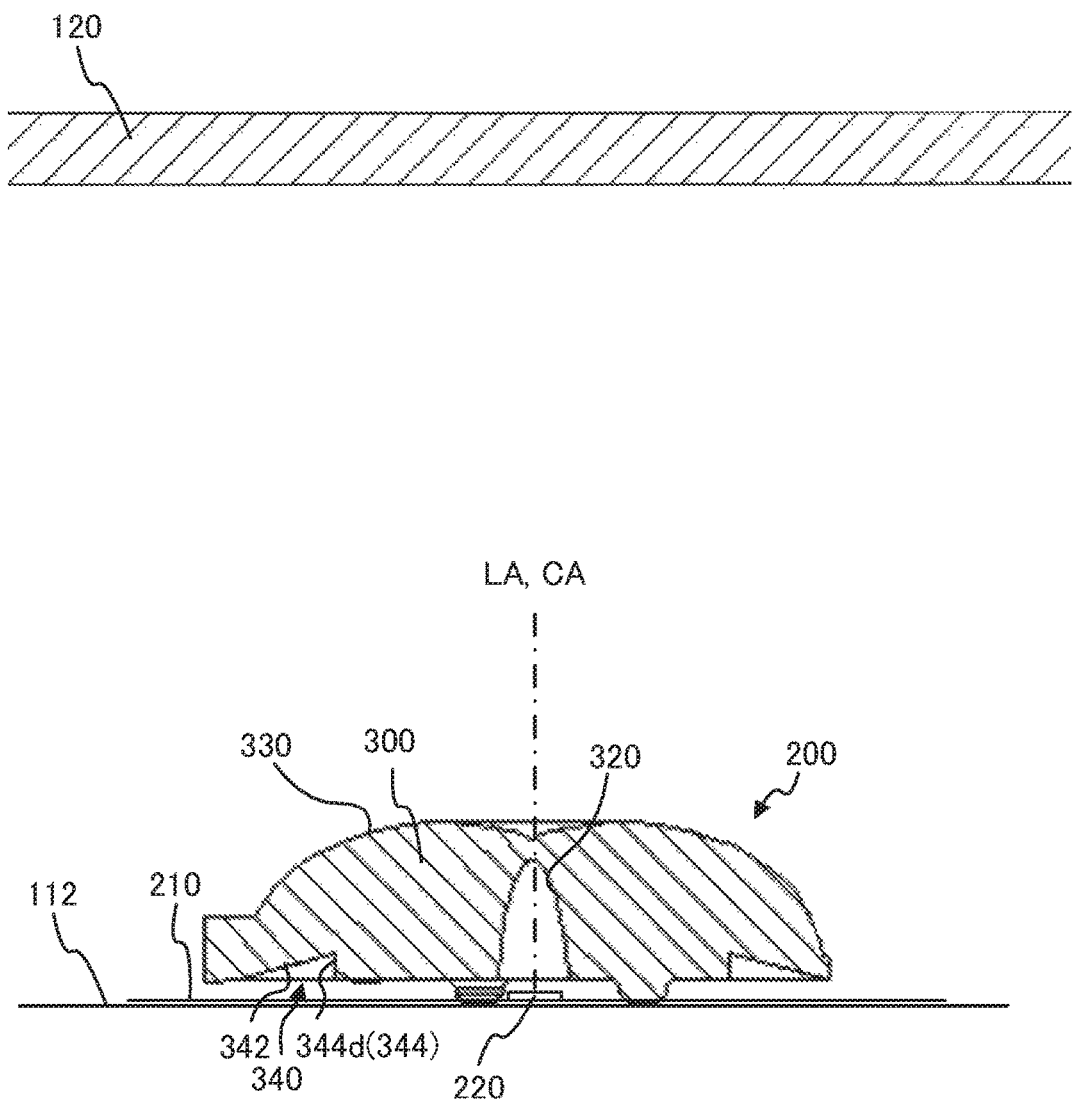
FIG. 7 is an enlarged partially enlarged sectional view of FIG. 6B.

FIGS. 5A to 7 illustrate a configuration of the surface light source device according to the embodiment of the present invention. FIG. 5A is a plan view, and FIG. 5B is a front view. FIG. 6A is a sectional view taken along line 6A-6A of FIG. 5B, and FIG. 6B is a sectional view taken along line 6B-6B of FIG. 5A. FIG. 7 is a partially enlarged sectional view of FIG. 6B.

As illustrated in FIGS. 5A to 6B, surface light source device 100 according to the embodiment of the present invention includes casing 110, a plurality of light-emitting devices 200 and light diffusion member 120. Light-emitting devices 200 are disposed in a matrix on bottom plate 112 of casing 110. The inner surface of bottom plate 112 functions as a diffusive reflection surface. In addition, top plate 114 of casing 110 is provided with an opening. Light diffusion member 120 is disposed to cover the opening, and functions as a light emitting surface. The light emitting surface may have a size of, for example, approximately 400 mm×approximately 700 mm.

As illustrated in FIG. 7, light-emitting devices 200 are fixed on substrate 210. A plurality of substrates 210 are fixed at respective predetermined positions on bottom plate 112 of casing 110. As illustrated in FIG. 7, each light-emitting device 200 includes light emitting element 220 and light flux controlling member 300.

Light emitting element 220 is a light source of surface light source device 100, and is mounted on substrate 210. Light emitting element 220 is a light-emitting diode (LED) such as a white light-emitting diode, for example. Light emitting element 220 may be an LED of chip-on-board (COB) type from the viewpoint of the ease of mounting and high light emission efficiency.

LEDs of COB type are known to emit a greater quantity of light in the lateral direction in comparison with conventional LEDs. In the case where light-emitting element 220 is an LED of a COB type and the like which emits a large quantity of light in the lateral direction, it is preferable that the top surface of the light emitting element be located on the upper side relative to the lower end of recess 310 (described later) of the light flux controlling member in the vertical direction from the viewpoint of facilitating incidence on the light flux controlling member of a large quantity of light which is emitted in the lateral direction of the LED. It is to be noted that light-emitting element 220 in FIG. 7 is a normal LED (an LED of a package type).

Light flux controlling member 300 is a lens, and is fixed on substrate 210. Light flux controlling member 300 controls the distribution of light emitted from light emitting element 220, and spreads the light travelling direction in the plane direction of the substrate. Light flux controlling member 300 is disposed over light emitting element 220 in such a manner that its central axis CA matches light axis LA of light emitting element 220 (see FIGS. 7A to 7C). It is to be noted that each of incidence surface 320 and emission surface 330 of light flux controlling member 300 described later is rotationally symmetrical (circularly symmetrical), and the rotational axes thereof coincide with each other. The rotational axes of incidence surface 320 and emission surface 330 are referred to as "central axis CA of light flux controlling member." In addition, "light axis LA of light emitting element" refers to a central light beam of a stereoscopic light flux from light emitting element 220.

Light flux controlling member 300 can be formed by integral molding. The material of light flux controlling member 300 is not limited as long as light of a desired wavelength can pass therethrough. For example, the material of light flux controlling member 100 is an optically transparent resin such as polymethylmethacrylate (PMMA), polycarbonate (PC), epoxy resin (EP); and silicone resin, or glass.

A main feature of surface light source device 100 according to the embodiment of the present invention is the configuration of light flux controlling member 300. Therefore, light flux controlling member 300 will be separately described in detail.

Light diffusion member 120 is a plate-shaped member (diffusion plate) having a light diffusing property, and allows the light emitted from light-emitting device 200 to pass therethrough while diffusing the light. Normally, the size of light diffusion member 120 is substantially the same as that of the member to be irradiated such as a liquid crystal panel. For example, light diffusion member 120 is formed of a light transmissive resin such as polymethylmethacrylate (PMMA), polycarbonate (PC), polystyrene (PS), and styrene methyl methacrylate copolymerization resin (MS). For the purpose of providing a light diffusing property, minute irregularities are formed on the surface of light diffusion member 120, or diffusing members such as beads are dispersed in light diffusion member 120.

In surface light source device 100 according to the embodiment of the present invention, the light emitted from light emitting elements 220 are spread by respective light flux controlling members 300 so as to illuminate light diffusion member 120 over a wide range. The light emitted from each light flux controlling member 300 is further diffused by light diffusion member 120. As a result, surface light source device 100 according to the embodiment of the present invention can uniformly illuminate a planar member (for example, a liquid crystal panel).

(Configuration of Light Flux Controlling Member)

Figure 8:
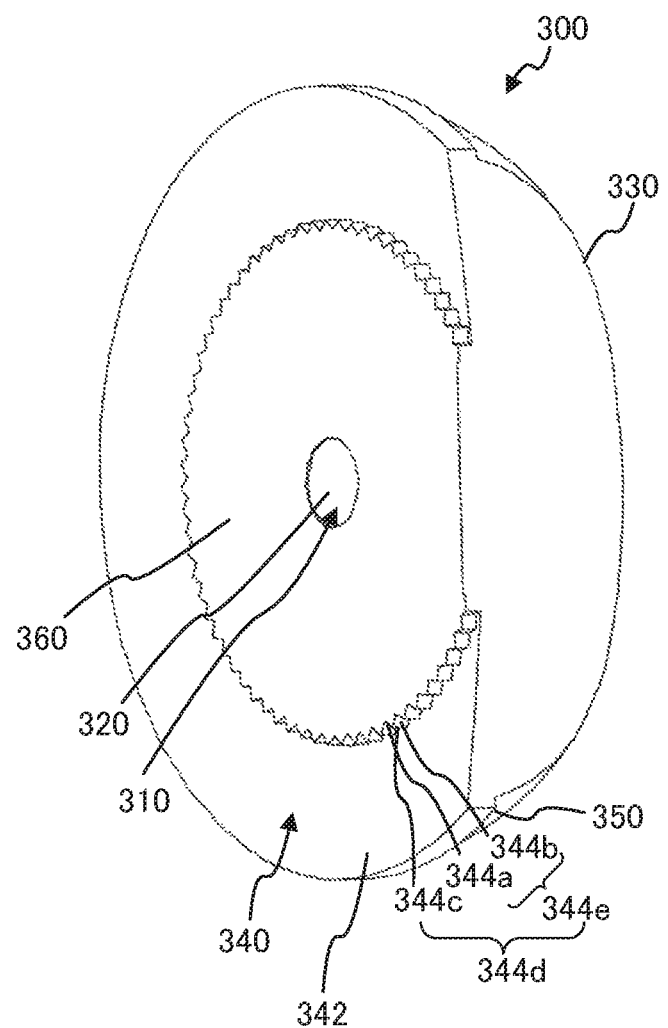
FIG. 8 illustrates a configuration of a light flux controlling member according to the embodiment of the present invention.
Figure 9A:
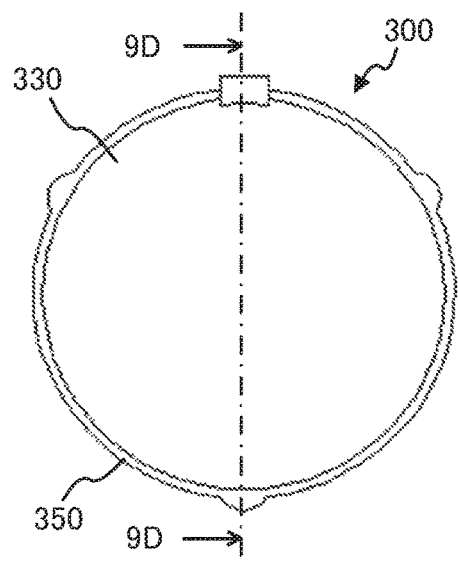
FIGS. 9A to 9D illustrate a configuration of the light flux controlling member according to the embodiment of the present invention.
Figure 9B:
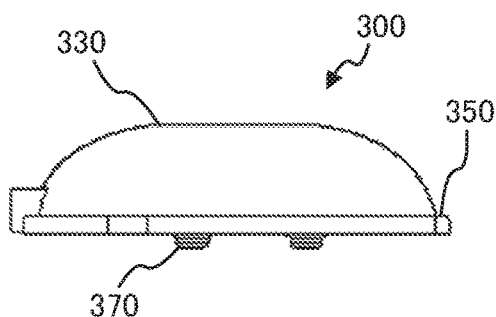
Figure 9C:
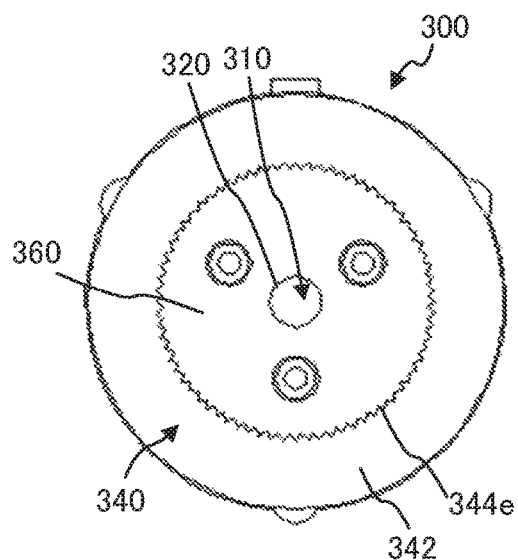
Figure 9D:
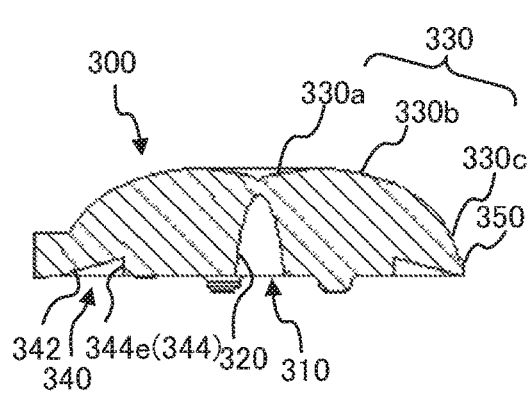

FIGS. 8 to 9D illustrate a configuration of light flux controlling member 300 according to the embodiment of the present invention. FIG. 8 is a perspective view as viewed from a rear side (substrate 210 side), in which a gate part and a leg part are omitted. FIG. 9A is a plan view, FIG. 9B is a front view, FIG. 9C is a bottom view, and FIG. 9D is a sectional view taken along line 9D-9D of FIG. 9A.

As illustrated in FIG. 8, light flux controlling member 300 includes recess 310 that forms incidence surface 320, emission surface 330, annular groove part 340, and flange part 350. In FIG. 8, the leg part provided on the rear surface of light flux controlling member 300 is omitted.

Recess 310 is formed at a center portion on the rear side (light emitting element 220 side) of light flux controlling member 300. The inner surface of recess 310 functions as incidence surface 320. Incidence surface 320 allows most or all of light emitted from light emitting element 220 to enter light flux controlling member 300 while controlling the travelling direction of the light. Incidence surface 320 intersects central axis CA of light flux controlling member 300, and is rotationally symmetrical (circularly symmetrical) about central axis CA.

Emission surface 330 is formed on the front side (light diffusion member 120 side) of light flux controlling member 300 to protrude from flange part 350. Emission surface 330 emits the light having entered light flux controlling member 300 to the outside while controlling the travelling direction of the light. Emission surface 330 intersects central axis CA, and is rotationally symmetrical (circularly symmetrical) about central axis CA.

Emission surface 330 includes first emission surface 330a located in a predetermined range around central axis CA, second emission surface 330b continuously formed at the periphery of first emission surface 330a, and third emission surface 330c that connects second emission surface 330b and flange part 350 (see FIG. 9D). First emission surface 330a is a curved surface protruding toward the rear side. Second emission surface 330b is a smooth curved surface located at the periphery of first emission surface 330a and protruding toward the front side. Second emission surface 330b has an annular protruding shape. Third emission surface 330c is a curved surface located at the periphery of second emission surface 330b. In the cross section of FIG. 9D, third emission surface 330c may have a linear shape, or a curved shape.

Annular groove part 340 is formed on rear surface 360 that extends in the radial direction from the opening edge of recess 310 on the rear side (substrate 210 side) of light flux controlling member 300 (see FIGS. 8 and 9C). To be more specific, annular groove part 340 is formed at a position outside recess 310 (in a region remote from central axis CA relative to recess 310) on the rear side of light flux controlling member 300 in such a manner as to surround central axis CA. Annular groove part 340 includes outer inclined surface 342 and inner surface 344 disposed on the inner side of outer inclined surface 342 with respect to central axis CA. Here, the inclined surface means a surface that is tilted with respect to a virtual line orthogonal to central axis CA (a surface that intersects the virtual line at a predetermined angle).

Outer inclined surface 342 is tilted such that the distance thereof from central axis CA increases toward the rear side. The inclination angle of outer inclined surface 342 with respect to the virtual line orthogonal to central axis CA is set to an angle at which at least a part of light which has entered light flux controlling member 300 from incidence surface 320 and has been fresnel-reflected by emission surface 330 is reflected in a direction away from central axis CA, and for example, the inclination angle is 45 degrees or smaller.

In the case where the inclination surface has a linear shape in the cross section including central axis CA, the inclination angle of outer inclined surface 342 with respect to the virtual line orthogonal to central axis CA (hereinafter also referred to simply as "inclination angle") means an angle between the straight line of the linear shape and the virtual line orthogonal to central axis CA, whereas in the case where the inclination surface has a curved shape in the cross section including central axis CA, the inclination angle means an angle between the virtual line orthogonal to central axis CA and a straight line that connects a point closest to emission surface 330 and a point remotest from emission surface 330 on the inclination surface in the cross section including central axis CA.

Figure 1A:
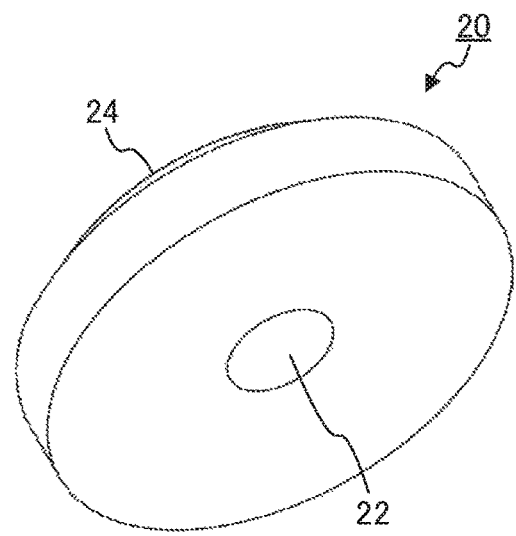
FIGS. 1A to 1C illustrate a configuration of a conventional light flux controlling member.
Figure 1B:
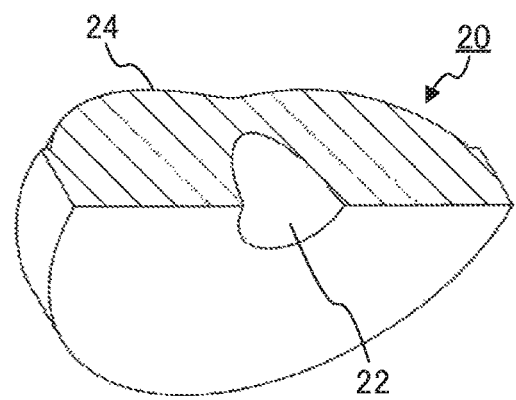
Figure 1C:
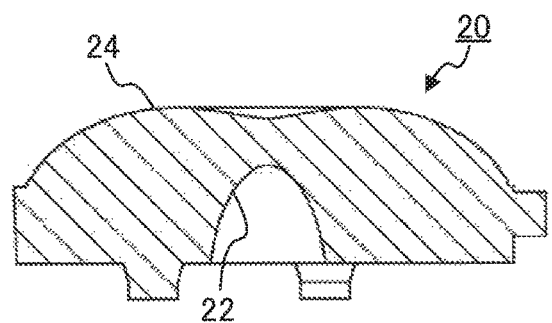
Figure 2A:
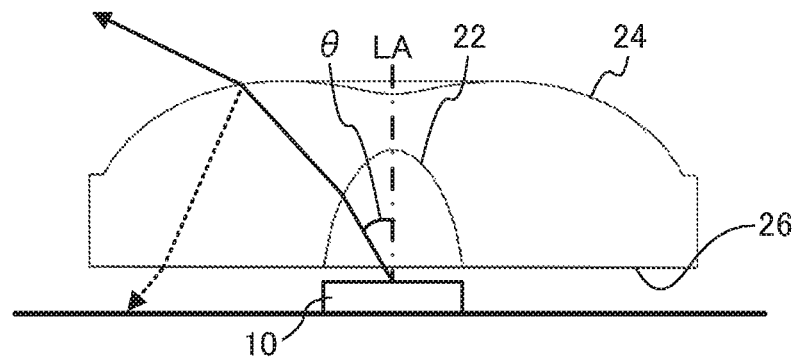
FIGS. 2A and 2B illustrate light paths of the light flux controlling member illustrated in FIGS. 1A to 1C.
Figure 2B:
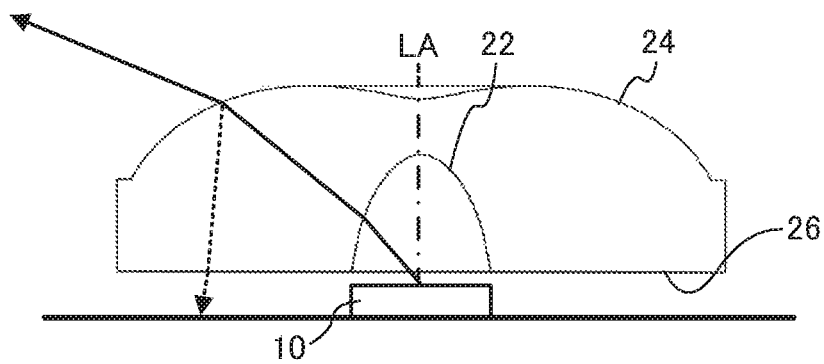
Figure 3A:
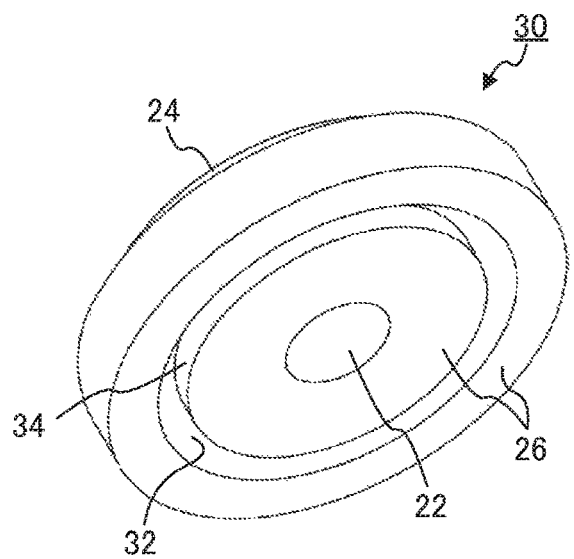
FIGS. 3A to 3C illustrate a configuration of the light flux controlling member disclosed in PTL 1.
Figure 3B:
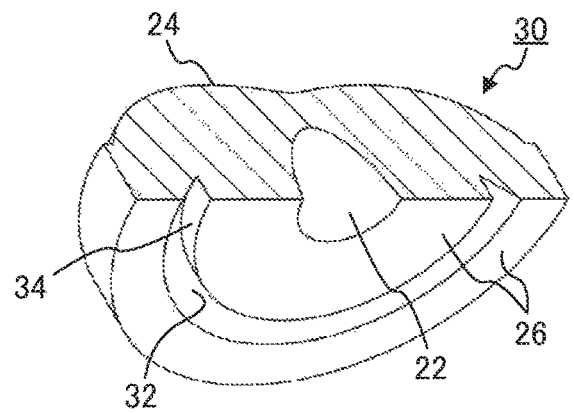
Figure 3C:
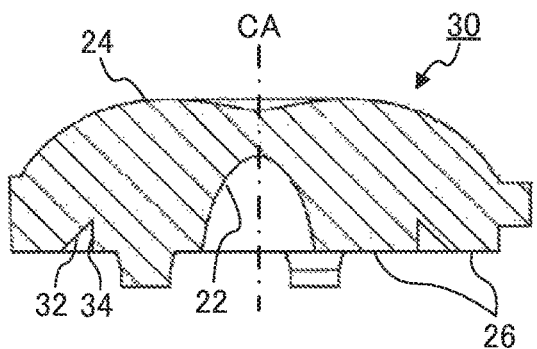
Figure 4A:
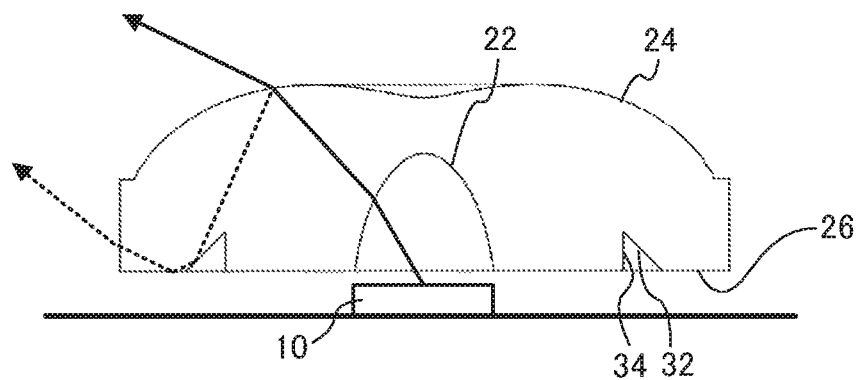
FIGS. 4A and 4B illustrate light paths of the light flux controlling member illustrated in FIGS. 3A to 3C.
Figure 4B:
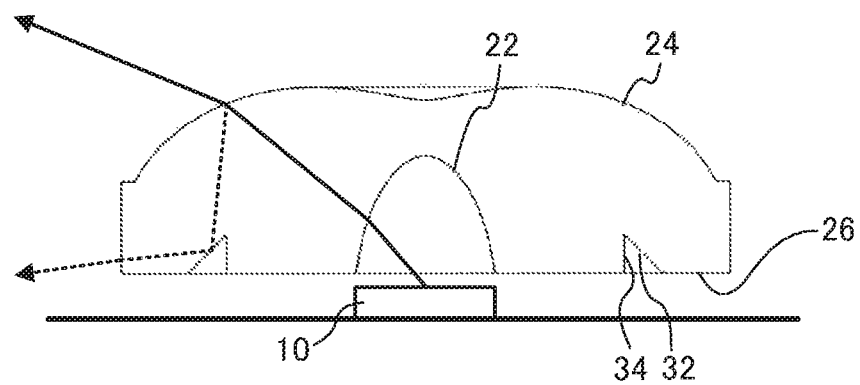

With this configuration, at least a part of the fresnel-reflected light which reaches outer inclined surface 342 is reflected in the lateral direction by outer inclined surface 342. It is thus possible to reduce luminance unevenness which is caused when the light fresnel-reflected at emission surface 330 is further reflected at substrate 210, and to reduce loss of light which is caused when the light is absorbed at substrate 210 (see FIG. 4).

Outer inclined surface 342 is provided in a region where the light that has entered light flux controlling member 300 from incidence surface 320 and has been fresnel-reflected by emission surface 330 reaches. The region where the light that has entered light flux controlling member 300 from incidence surface 320 and has been fresnel-reflected by emission surface 330 reaches can be set to a region including regions where most of the light paths reach in a simulation in which light paths are simulated by changing the inclination angle of outer inclined surfaces 342 among different angles, for example.

Inner surface 344 includes a plurality of retro-reflection parts 344e. Retro-reflection parts 344e have a function of retro-reflecting, in a direction toward incidence surface 320, light incident on incidence surface 320 which reaches inner surface 344. The "retro-reflection" used herein means a control of light to travel toward incidence surface 320 by reflecting, at least two times, light which is directly incident on inner surface 344 from incidence surface 320 (particularly, light which travels in a direction substantially orthogonal to central axis CA). Specifically, the "direction toward incidence surface 320" means a direction toward central axis CA.

In the present embodiment, a plurality of first protrusions 344d rotationally symmetrical about central axis CA are provided on the inner side in annular groove part 340 (see FIGS. 8 and 9C). First protrusion 344d includes first inclined surface 344a that forms inner surface 344, second inclined surface 344b that forms inner surface 344, and ridgeline 344c that is an intersection line of first inclined surface 344a and second inclined surface 344b (see FIG. 8). Retro-reflection part 344e includes first inclined surface 344a and second inclined surface 344b.

Each of first inclined surface 344a and second inclined surface 344b has a planar shape. Preferably, the angle between first inclined surface 344a and second inclined surface 344b is 90 degrees, and may be any angle as long as light directly incident on incidence surface 320 (particularly, light which travels in a direction substantially orthogonal to central axis CA) can be retro-reflected in a direction toward incidence surface 320.

Ridgeline 344c is parallel to central axis CA, or is tilted such that the distance thereof from central axis CA increases toward the front side. In the case where ridgeline 344c is tilted such that the distance thereof from central axis CA increases toward the front side, it is preferable that the angle of ridgeline 344c with respect to central axis CA (the inclination angle of ridgeline 344c) in the cross section including central axis CA be smaller than 5 degrees in view of ensuring a sufficient angle as a removal taper in the shaping of light flux controlling member 300. Preferably, ridgeline 344c is parallel to central axis CA from the view point of the ease of retro-reflection, in a direction toward incidence surface 320, of light which is incident on inner surface 344.

One first inclined surface 344a and one second inclined surface 344b of retro-reflection part 344e form one protrusion.

Flange part 350 is located between the outer periphery portion of emission surface 330 and the outer periphery portion of light flux controlling member 300 on the rear side thereof, and is protruded outward with respect to central axis CA. Flange part 350 has a substantially annular shape. Flange part 350 is not an essential component; however, by providing flange part 350, the ease of the handling and alignment of light flux controlling member 300 increases. The thickness of flange part 350 is determined in consideration of a desired dimension of emission surface 330, formability of flange part 350 and the like.

A plurality of leg parts 370, which are optionally formed, are substantially columnar shaped members protruding from the rear side of light flux controlling member 300. Leg parts 370 support light flux controlling member 300 at a suitable position with respect to light emitting element 220 (see FIGS. 9B and 9C).

Figure 10A:
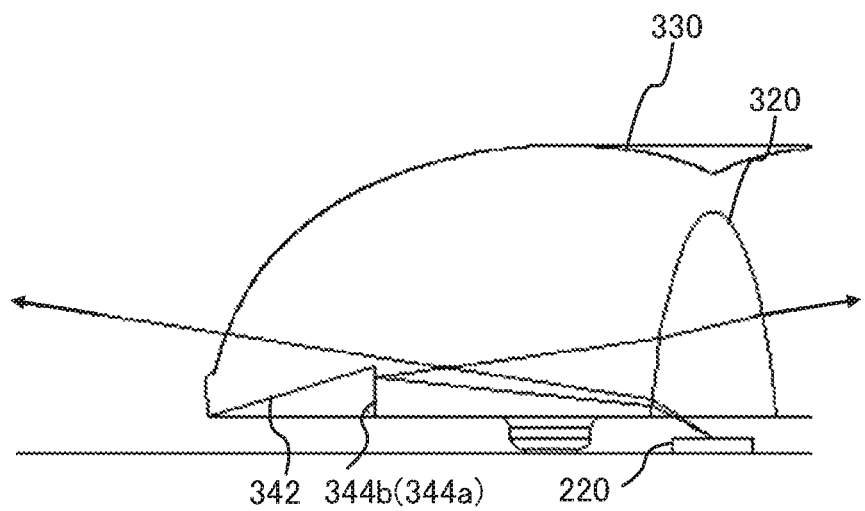
FIGS. 10A and 10B illustrate light paths of the light flux controlling member illustrated in FIG. 8.
Figure 10B:
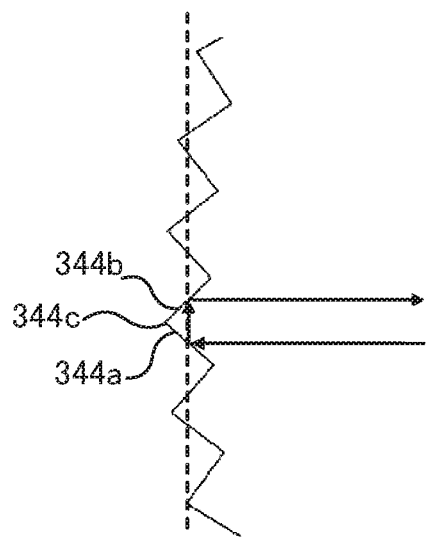
Figure 11:
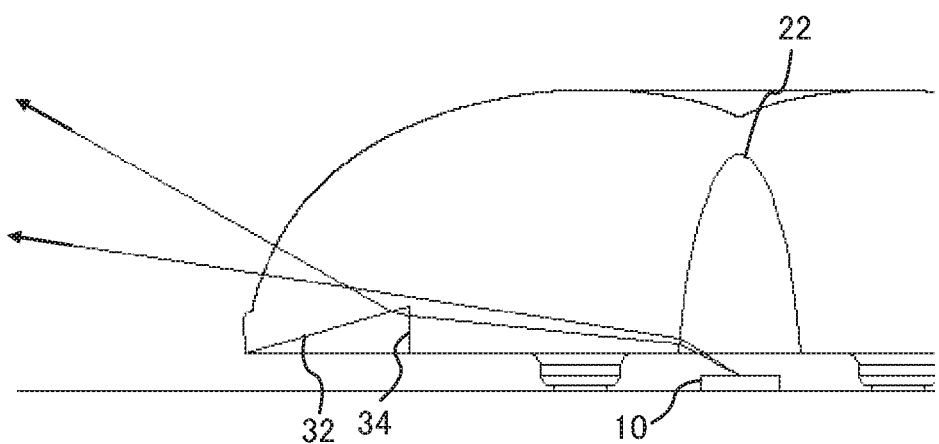
FIG. 11 illustrates light paths of a light flux controlling member for comparison.

The operation of the light flux controlling member according to the present embodiment is described by comparison between FIGS. 10A and 10B, and FIG. 11. FIG. 10A illustrates light paths of the light flux controlling member illustrated in FIG. 8, and FIG. 10B illustrates light paths as viewed from the bottom surface of FIG. 10A. FIG. 11 illustrates light paths of a light flux controlling member for comparison.

In a conventional light flux controlling member, the inner surface of the annular groove part is a curved surface that is approximately parallel to with respect to central axis CA, and the plurality of retro-reflection parts 344e are not provided (see, for example, surface 34 in FIG. 11). Consequently, a large part of the light which travels in a direction substantially orthogonal to central axis CA passes through the inner surface, and is refracted in a particular direction by the outer inclined surface (see, for example, light paths in FIG. 11). With such light, luminance unevenness is generated in the light applied from the surface light source device.

In contrast, in light flux controlling member 300 according to the present embodiment, inner surface 344 of annular groove part 340 is provided with a plurality of retro-reflection parts 344e. With this configuration, light which travels from incidence surface 320 in a direction substantially orthogonal to central axis CA is reflected by first inclined surface 344a and then further reflected by second inclined surface 344b, whereby the light can be retro-reflected to the incidence surface 320 side (see light paths in FIGS. 10A and 10B). In this manner, it is possible to reduce a situation where the amount of light which is refracted by the outer inclined surface in a particular direction excessively increases as illustrated in FIG. 11. In addition, the light retro-reflected by retro-reflection part 344e travels in the lateral direction of the light flux controlling member (see the light paths in FIG. 10A). Accordingly, retro-reflection parts 344e provided at inner surface 344 of annular groove part 340 can reduce a situation where the amount of light which is refracted by the outer inclined surface in a particular direction excessively increases, and can suppress the generation of the luminance unevenness.

(Simulation Result of Luminance Distribution)

Now, results of a simulation of the luminance distribution on a diffusion plate in the case where a diffusion plate is disposed over light flux controlling member 300 are described. Also, for comparison, results of a simulation of the luminance distribution on a diffusion plate in the case where a diffusion plate is disposed over the light flux controlling member for comparison having the same configuration except that a plurality of retro-reflection parts 344e are not provided are described.

The luminance distribution on a diffusion plate located on the upper side of light flux controlling member 300 or the light flux controlling member for comparison was examined with light-emitting element 220 that is an LED, and light flux controlling member 300 or the light flux controlling member for comparison disposed on substrate 210 as illustrated in FIG. 7. It is to be noted that light-emitting element 220 was placed such that the top surface thereof is located below the lower end of recess 310 of light flux controlling member 300 or the light flux controlling member for comparison. The two light flux controlling members used in the simulation, light flux controlling member 300 and the light flux controlling member for comparison, are different from each other only in whether the plurality of retro-reflection parts 344e are provided. The angle between first inclined surface 344a and second inclined surface 344b in retro-reflection part 344e was set to 90 degrees. The parameters of light flux controlling member 300 and the light flux controlling member for comparison were as follows.

(Common Parameters)

Figure 12:
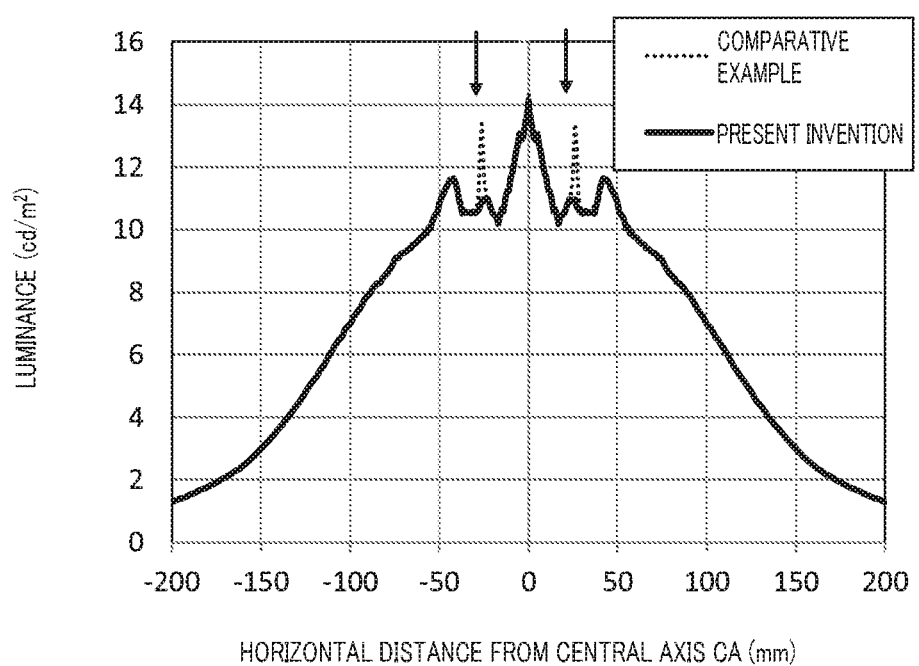
FIG. 12 is a graph showing simulation results of a luminance distribution on a diffusion plate in the case where the diffusion plate is disposed over each of the light flux controlling members illustrated in FIGS. 10A to 11.

Outer diameter of light flux controlling member: 19.0 mm
Outer diameter of emission surface: 18.6 mm
Opening diameter of recess: 2.25 mm
Height from substrate surface to edge of incidence surface: 0.7 mm
Internal diameter of outer inclined surface: 12.0 mm
Outer diameter of outer inclined surface: 19.0 mm
Height of internal diameter portion of outer inclined surface: 0.7 mm
Height of light-emitting element: 0.35 mm
Size of light-emitting element: 1.0 mm×1.0 mm
Distance between substrate surface and diffusion plate: 19 mm FIG. 12 shows simulation results of the luminance distribution on the diffusion plate in the case where the diffusion plate is disposed over each of the light flux controlling member for comparison illustrated in FIG. 11 and light flux controlling member 300 illustrated in FIG. 8. In FIG. 12, the ordinate indicates luminance ($cd/m^2$), and the abscissa indicates a distance (mm) from central axis CA of light flux controlling member in the horizontal direction. The broken line indicates simulation results of the light flux controlling member for comparison, and the heavy line indicates simulation results of light flux controlling member 300.

As is clear from FIG. 12, in the light flux controlling member for comparison, portions (indicated with two arrows in the drawing) where the luminance is high relative to surrounding portions are generated in regions approximately 25 mm from central axis CA of light-emitting device in the horizontal direction. In contrast, in light flux controlling member 300 according to the present embodiment, such high luminance portions were not generated.

While first protrusion 344d is formed in a columnar shape having a substantially triangular cross-sectional shape in the direction orthogonal to ridgeline 344c in the present embodiment, the present invention is not limited to this. For example, first protrusion 344d may be formed in a grid. The protrusions of the grid may have a triangular pyramid shape or a square pyramid shape, for example.

Figure 13:
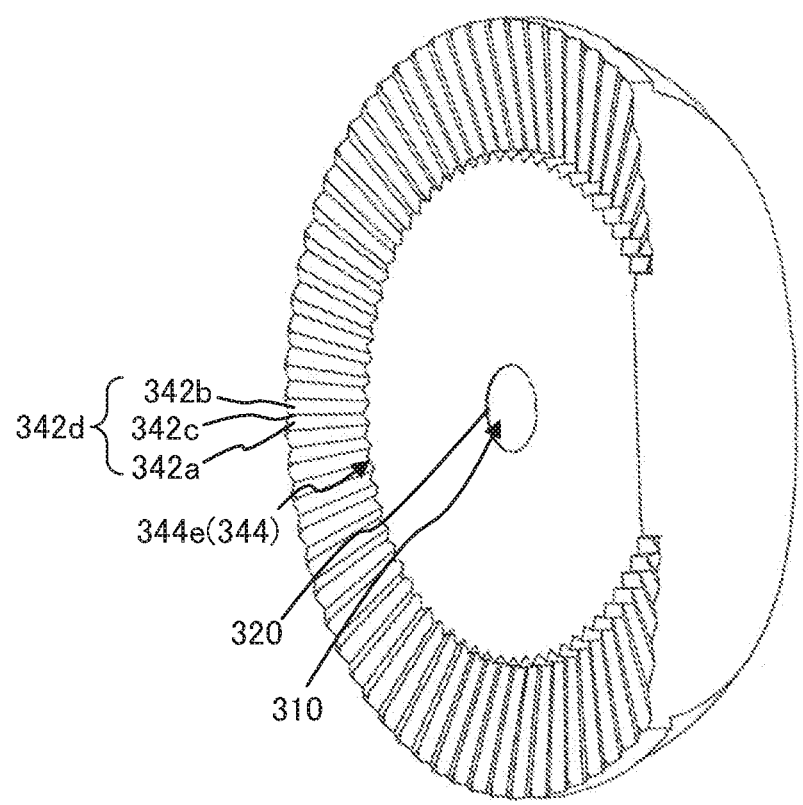
FIG. 13 illustrates another configuration of the light flux controlling member according to the embodiment of the present invention.

In addition, while a plurality of first protrusions 344d are provided on the inner side in annular groove part 340 in the present embodiment, the present invention is not limited to this. FIG. 13 illustrates another configuration of the light flux controlling member according to the embodiment of the present invention. As illustrated in FIG. 13, a plurality of second protrusions 342d rotationally symmetrical about central axis CA may further be provided on the outer side in annular groove part 340.

Second protrusion 342d includes third inclined surface 342a that forms outer inclined surface 342, fourth inclined surface 342b that forms outer inclined surface 342, and ridgeline 342c that is the intersection line of third inclined surface 342a and fourth inclined surface 342b. Each of third inclined surface 342a and fourth inclined surface 342b has a planar shape. Such a plurality of second protrusions 342d facilitate the reflection in a direction away from central axis CA of light which has entered light flux controlling member 300 from incidence surface 320 and has been fresnel-reflected by emission surface 330. As a result, generation of luminance unevenness can be remarkably suppressed. Also, it may suppress a situation where stray light in the system of surface light source device 100 enters light flux controlling member 300 from emission surface 330, reaches outer inclined surface 342 so as to be reflected by a plurality of second protrusions 342d, and then reaches the substrate immediately below light flux controlling member 300. This may suppress the reduction in light use efficiency.

This application is entitled to and claims the benefit of Japanese Patent Application No. 2015-174771 filed on Sep. 4, 2015, the disclosure each of which including the specification, drawings and abstract is incorporated herein by reference in its entirety.

INDUSTRIAL APPLICABILITY

The light flux controlling member, the light-emitting device and the surface light source device according to the embodiments of the present invention are applicable to, for example, a backlight of liquid crystal display apparatuses or generally-used illumination apparatuses.

REFERENCE SIGNS LIST

10 Light-emitting element
20, 30 Light flux controlling member
22 Incidence surface
24 Emission surface
26 Rear surface
32 Inclined surface
34 Surface approximately parallel to central axis
100 Surface light source device
110 Casing
112 Bottom plate
114 Top plate
120 Light diffusion member
200 Light-emitting device
210 Substrate
220 Light-emitting element
300 Light flux controlling member
310 Recess
320 Incidence surface
330 Emission surface
330a First emission surface
330b Second emission surface
330c Third emission surface
340 Annular groove part
342 Outer inclined surface
342a Third inclined surface
342b Fourth inclined surface
342c Ridgeline
342d Second protrusion
344 Inner surface
344a First inclined surface
344b Second inclined surface
344c Ridgeline
344d First protrusion
344e Retro-reflection part
350 Flange part
360 Rear surface
370 Leg part
CA Central axis of light flux controlling member
LA Light axis of light-emitting element

The invention claimed is:

1. A light flux controlling member configured to control distribution of light emitted from a light-emitting element, the light flux controlling member comprising:
an incidence surface that is an interior surface of a recess formed to intersect a central axis of the light flux controlling member on a rear side of the light flux controlling member, the incidence surface being configured to allow incidence of light emitted from the light-emitting element;
an emission surface formed to intersect the central axis on a front side of the light flux controlling member, the emission surface being configured to emit, to outside, light incident on the incidence surface; and
an annular groove part formed outside the incidence surface on the rear side to surround the central axis,
wherein:
the annular groove part includes:
an outer inclined surface tilted such that a distance of the outer inclined surface from the central axis increases toward the rear side, and
an inner surface disposed on an inner side relative to the outer inclined surface with respect to the central axis,
the outer inclined surface is tilted at an angle at which at least a part of light which has entered the light flux controlling member from the incidence surface and has been fresnel-reflected by the emission surface is reflected in a direction away from the central axis, and
the inner surface includes a plurality of retro-reflection parts configured to reflect the light which has entered the light flux controlling member from the incidence surface toward the incidence surface to pass through the incidence surface.

2. The light flux controlling member according to claim 1, wherein:
a plurality of first protrusions are provided on an inner side in the annular groove part;
each of the plurality of first protrusions includes:
a first inclined surface serving as the inner surface,
a second inclined surface serving as the inner surface, and
a ridgeline that is an intersection line of the first inclined surface and the second inclined surface;
the ridgeline is parallel to the central axis, or is tilted such that a distance of the ridgeline from the central axis increases toward the front side; and
the retro-reflection part includes the first inclined surface and the second inclined surface.

3. The light flux controlling member according to claim 1, wherein:
a plurality of second protrusions are provided on an outer side in the annular groove part;
each of the plurality of second protrusions includes:
a third inclined surface serving as the outer inclined surface,
a fourth inclined surface serving as the outer inclined surface, and
a ridgeline that is an intersection line of the third inclined surface and the fourth inclined surface; and
the ridgeline is tilted such that a distance of the ridgeline from the central axis increases toward the rear side.

4. A light-emitting device comprising:
a light-emitting element; and
the light flux controlling member according to claim 1, wherein:
the central axis of the light flux controlling member and a light axis of the light-emitting element coincide with each other.

5. A surface light source device comprising:
the light-emitting device according to claim 4; and
a light diffusion member configured to allow light from the light-emitting device to pass through the light diffusion member while diffusing the light.

* * * * *